United States Patent
Ali

(10) Patent No.: US 7,253,686 B2
(45) Date of Patent: Aug. 7, 2007

(54) DIFFERENTIAL AMPLIFIERS WITH ENHANCED GAIN AND DYNAMIC RANGE

(75) Inventor: Ahmed Mohamed Abdelatty Ali, Oak Ridge, NC (US)

(73) Assignee: Analog Devices, Inc., Norwood, MA (US)

( * ) Notice: Subject to any disclaimer, the term of this patent is extended or adjusted under 35 U.S.C. 154(b) by 131 days.

(21) Appl. No.: 11/191,871

(22) Filed: Jul. 27, 2005

(65) Prior Publication Data
US 2007/0024368 A1  Feb. 1, 2007

(51) Int. Cl.
*H03F 3/45* (2006.01)
(52) U.S. Cl. .................................. 330/259; 330/258
(58) Field of Classification Search ............... 330/253, 330/258, 259, 290
See application file for complete search history.

(56) References Cited

U.S. PATENT DOCUMENTS

| | | | | |
|---|---|---|---|---|
| 5,281,924 A | * | 1/1994 | Maloberti et al. | 330/253 |
| 5,587,687 A | | 12/1996 | Adams | 330/253 |
| 5,838,199 A | * | 11/1998 | Nakamura | 330/258 |
| 5,847,607 A | | 12/1998 | Lewicki et al. | 330/258 |
| 5,963,084 A | | 10/1999 | Eschauzier | 327/553 |
| 5,986,502 A | | 11/1999 | Nakamura | 330/258 |
| 6,346,856 B1 | * | 2/2002 | Myers et al. | 330/258 |
| 6,429,700 B1 | * | 8/2002 | Yang | 330/258 |
| 6,580,325 B1 | | 6/2003 | Aude | 330/260 |
| 6,677,822 B2 | * | 1/2004 | Hasegawa | 330/258 |

OTHER PUBLICATIONS

Abo, Andrew M., et al., "A 1.5-V, 10-bit, 14.3-MS/s CMOS Pipeline Analog-to-Digital Converter", IEEE Journal of Solid-State Circuits, vol. 34, No. 5, May 1999, pp. 599-606.
Chang, Michael S., "An 86 mW, 80 Msample/sec, 10-bit Pipeline ADC", EECS 598 Mixed-Signal Design, F2002, Dec. 2002, 7 pages.
Dessent, Brian, et al., "A Two-Stage Fully Differntial Operational Transconductance Amplifier", EE240 Term Paper, University of California, Berkely, Spring 2001, 11 pages.

* cited by examiner

*Primary Examiner*—Khanh Van Nguyen
(74) *Attorney, Agent, or Firm*—Koppel, Patrick, Heybl & Dawson

(57) ABSTRACT

Differential amplifier embodiments are provided for amplifying input signals with enhanced gain and dynamic range. They include first and second amplifier stages and at least one common-mode feedback circuit that is arranged to mirror and adjust a tail current to control the common-mode level of a respective one of the stages. The stages are configured with cascode elements to obtain high impedances that enhance their signal gain and the common-mode feedback circuit is configured to controllably lower the output voltage of a current source that provides the tail current to thereby enhance the amplifier's dynamic range. The amplifier embodiments are particularly suited for use in applications where they must operate with reduced supply voltages and operate in alternating operational modes.

20 Claims, 5 Drawing Sheets

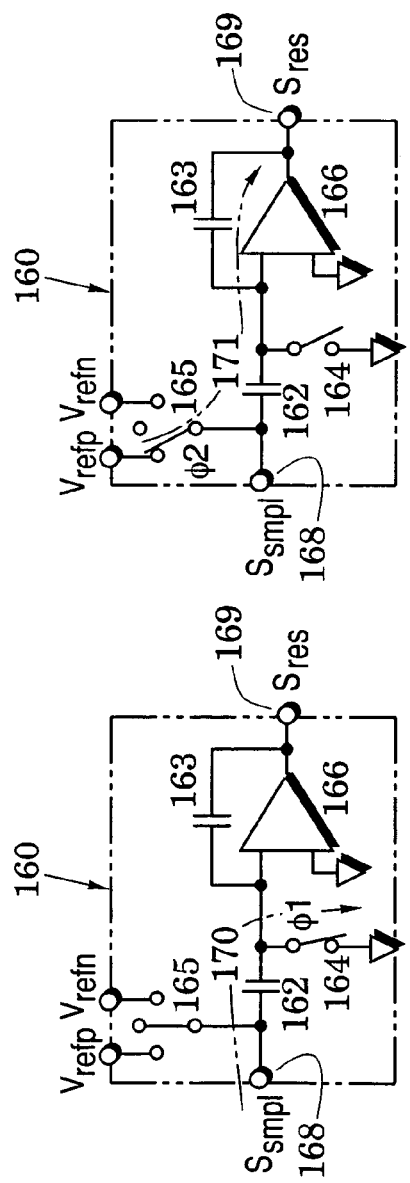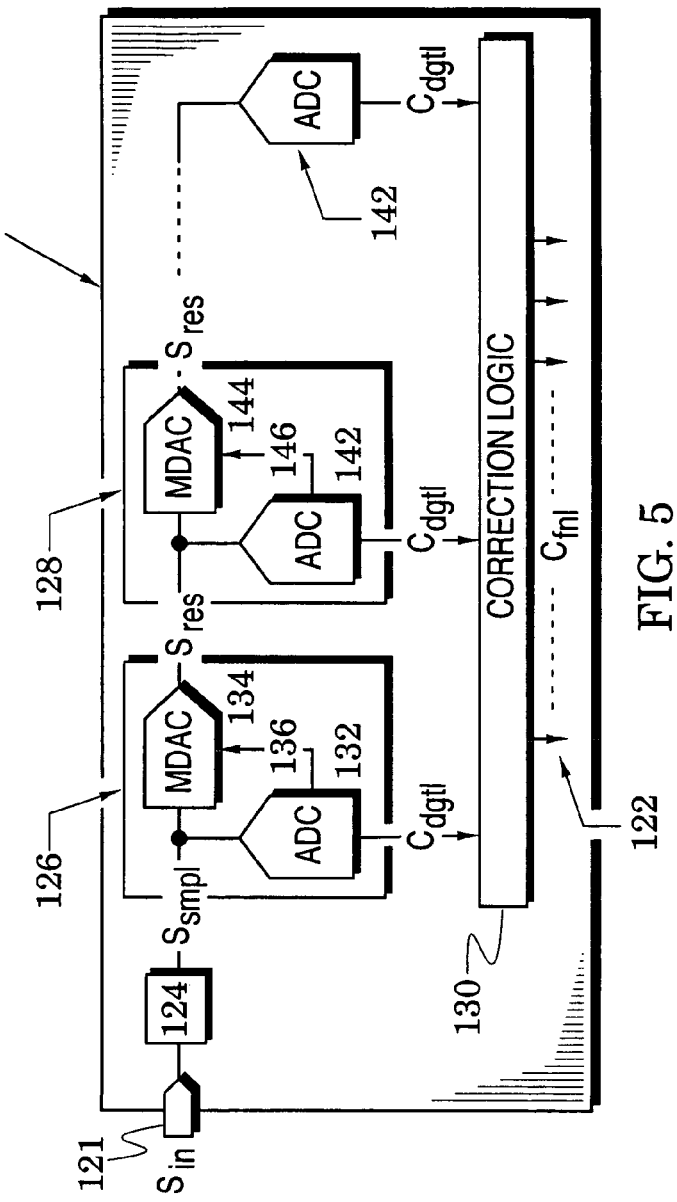

US 7,253,686 B2

DIFFERENTIAL AMPLIFIERS WITH ENHANCED GAIN AND DYNAMIC RANGE

BACKGROUND OF THE INVENTION

1. Field of the Invention

The present invention relates generally to differential amplifiers.

2. Description of the Related Art

Differential amplifiers are used in a variety of signal conditioning systems (e.g., pipelined signal converters) to generate residue signals for conversion in successive converter stages to thereby provide digital codes that correspond to analog input signals. The accuracy of the residue signals and, hence, that of the signal conversion, is closely linked to operational parameters (e.g., gain and dynamic range) of the differential amplifiers. Maintaining the quality of these amplifier parameters has become increasingly difficult as modern integrated circuits have had to operate with increasingly-smaller supply voltages. Substantial benefit would thus be provided by amplifier structures that enhance these parameters in an environment of reduced supply voltages.

BRIEF SUMMARY OF THE INVENTION

The present invention is directed to differential amplifiers that provide enhanced gain and dynamic range. The novel features of the invention are set forth with particularity in the appended claims. The invention will be best understood from the following description when read in conjunction with the accompanying drawings.

BRIEF DESCRIPTION OF THE DRAWINGS

FIG. 5 is a block diagram of a pipelined signal converter embodiment; and

FIGS. 6A and 6B are schematics of a switched-capacitor network of the converter of FIG. 5 that can effectively utilize the amplifier embodiments of FIGS. 1-4.

DETAILED DESCRIPTION OF THE INVENTION

FIGS. 1-6 illustrate differential amplifier embodiments that provide enhanced gain and dynamic range. These amplifier embodiments are especially useful in applications where reduced supply voltages tends to limit signal swing and in switched-capacitor applications that require alternating operational modes.

Figure 1:
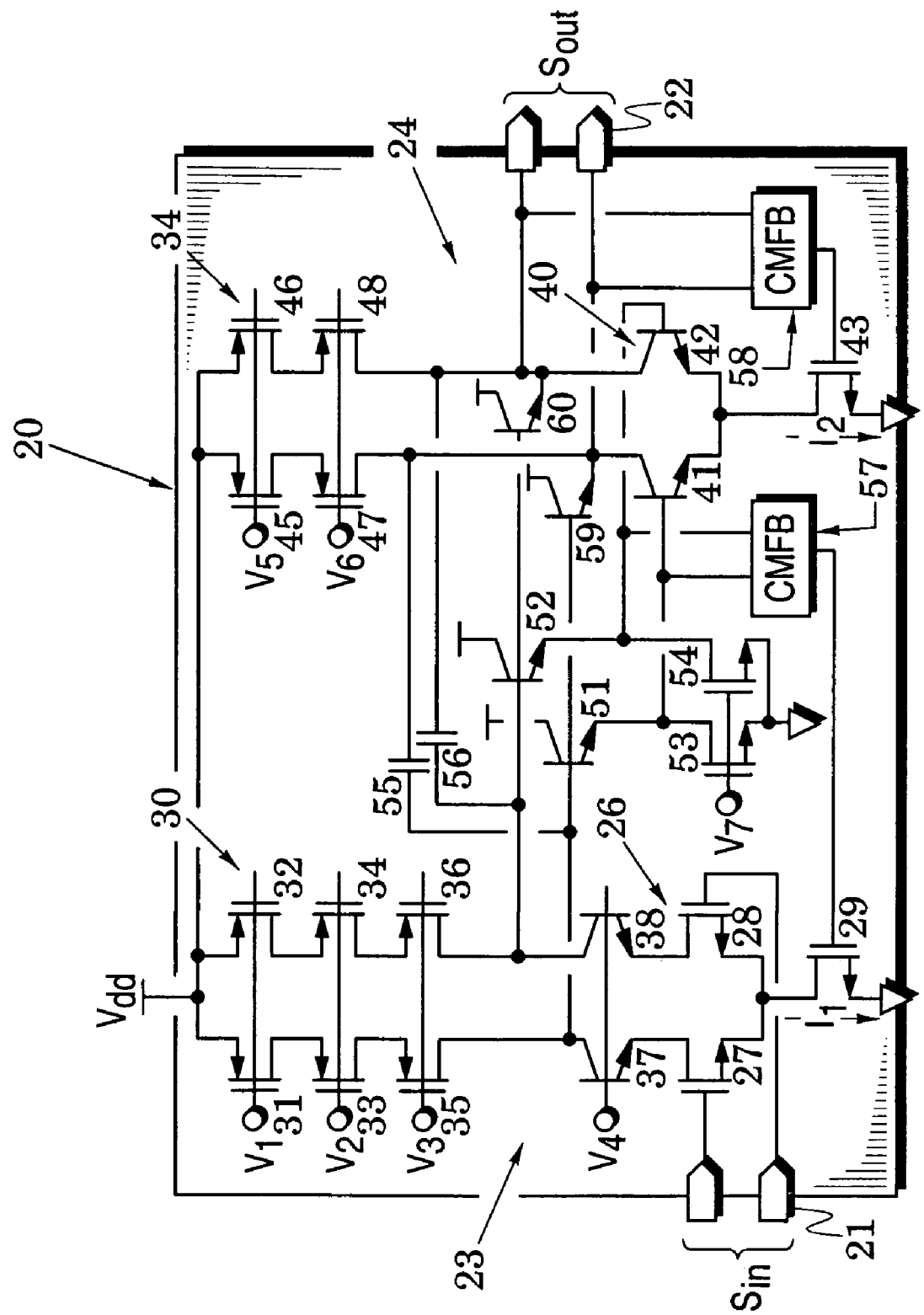
FIG. 1 is a schematic of a differential amplifier embodiment of the present invention.

In particular, FIG. 1 illustrates a differential amplifier 20 that processes signals from an amplifier input port 21 to an amplifier output port 22. It includes a first amplifier stage 23 that is arranged to receive differential analog signals $S_{in}$ from the input port 21 and a second amplifier stage 24 that is arranged to receive signals from the first amplifier stage and provide signals to the output port 22.

The first amplifier stage 23 is formed with a first differential pair 26 of transistors 27 and 28 that receives a first tail current $I_1$ from a first current-source transistor 29. An active differential load for this stage is formed with a pair of current-source transistors 31 and 32 which provide currents to the first differential pair 26 in response to a bias voltage $V_1$ that is received at their control terminals (e.g., gates).

Preferably, the output impedance of the current-source transistors is significantly enhanced with a first set of cascode transistors 33 and 34 and a second set of cascode transistors 35 and 36 that are inserted between the current-source transistors and the differential pair 26. The control terminals (e.g., gates) of the first set receive a cascode bias $V_2$ and the control terminals (e.g., gates) of the second set receive a cascode bias $V_3$. Also, the output impedance of the first differential pair 26 is preferably enhanced by insertion of cascode transistors 37 and 38 between the differential pair and the active load 30. The control terminals (e.g., gates) of these cascode transistors receive a cascode bias $V_4$.

The second amplifier stage 24 is formed with a second differential pair 40 of transistors 41 and 42 that receives a second tail current $I_2$ from a second current-source transistor 43. An active differential load for this stage is formed with a pair of current-source transistors 45 and 46 which provide currents to the second differential pair 40 in response to a bias voltage $V_5$ that is received at their control terminals (e.g., gates). Preferably, the output impedance of these current-source transistors is significantly enhanced with a set of cascode transistors 47 and 48 that are inserted between them and the second differential pair 40. The control terminals (e.g., gates) of this set receive a cascode bias $V_6$. The cascode transistors 47 and 48 also reduce parasitic capacitances at the amplifier output port 22.

In operation of the amplifier 20, the first amplifier stage 23 responds to differential signals at the input port 21 by providing output signals at a first differential port that is formed by the current terminals of the cascode transistors 37 and 38. The output signals are generated as the first differential pair 26 steers at least portions of the first tail current $I_1$ across the first differential port in response to the differential analog signals $S_{in}$ at the input port 21.

Signals from the first stage 23 are received at a second differential port that is formed by the control terminals (e.g., bases) of the second differential pair 40. The second amplifier stage 24 responds to these signals by providing output signals $S_{out}$ at the output port 22. The output signals are generated as the second differential pair 40 steers at least portions of the second tail current $I_2$ across its current terminals (e.g., collectors) in response to the differential signals at its control terminals (e.g., bases).

Preferably, the signals from the first differential port (current terminals of the cascode transistors 37 and 38) are level shifted as they are coupled to the second differential port (control terminals of the second differential pair 40). This level shifting facilitates the establishment of favorable common-mode levels for the first and second amplifier stages 23 and 24 which are subsequently described below.

In the amplifier embodiment of FIG. 1, the level shifting is provided by first and second follower transistors 51 and 52 that each have a control terminal (e.g., base) coupled to a respective terminal of the first differential port and a current terminal (e.g., emitter) coupled to a respective terminal of the second differential port. Bias currents are established in the transistor followers 51 and 52 by current-source transistors 53 and 54 which receive a bias voltage $V_7$ at their control terminals (e.g., gates) and are coupled to pull currents from current terminals (e.g., emitters) of the transistor followers.

Stability of the amplifier 20 of FIG. 1 is enhanced by inserting each of Miller-compensation capacitors 55 and 56 between a respective side of the output port 22 and a respective side of the first differential port (current terminals of the cascode transistors 37 and 38). These capacitors move a dominant pole of the open-loop transfer function of the amplifier 20 downward in frequency as they also move another open-loop transfer function pole upward in frequency.

These pole movements sufficiently reduce the open-loop gain of the amplifier at higher frequencies so that, when the amplifier is embedded in a feedback loop, it will have a stable closed-loop transfer function. Because of Miller multiplication (which occurs when a feedback capacitor is coupled across a gain element such as the second differential pair 40), this transfer-function compensation can be achieved with relatively-small capacitors that can be easily accommodated in an integrated-circuit amplifier structure.

The cascoded current-source transistors 31 and 32 (cascoded with cascode transistors 33-36) and the cascoded current-source transistors 45 and 46 (cascoded with cascode transistors 47, 48) substantially enhance the signal gains of the first and second differential stages 23 and 24 because they provide differential loads having extremely high impedances. These high impedances, however, fail to securely and reliably establish common-mode operating levels at the output ports of these stages.

Accordingly, a first common-mode feedback circuit 57 is provided to monitor the common-mode level at the second differential port (control terminals of the second differential pair 40) and mirror and adjust the first tail current $I_1$ to maintain a desired common-mode level at this port. In an amplifier embodiment, the current-source transistor 29 can be considered to be part of the first common-mode feedback circuit 57.

Similarly, a second common-mode feedback circuit 58 is provided to monitor the common-mode level at the amplifier output port 22 and mirror and adjust the second tail current $I_2$ to maintain a desired common-mode level at this port. In an amplifier embodiment, the current-source transistor 43 can be considered to be a part of the second common-mode feedback circuit 58.

The cascoded loads of the first and second differential pairs 26 and 40 and the cascode transistors 37 and 38 are arranged to significantly enhance the output impedances of the first and second amplifier stages 23 and 24 which substantially increases the signal gain of the differential amplifier 20. The first and second common-mode feedback circuits 57 and 58 are then configured to establish common-mode operating levels which are selected to significantly increase the dynamic range of the amplifier 20.

For example, the second common-mode feedback circuit 58 is configured to establish a second common-mode level at the output port 22 that enhances the dynamic range of signals at this port. In the amplifier embodiment shown in FIG. 1, the transistors 41 and 42 of the second differential pair 40 are bipolar junction transistors and the cascode transistors 47 and 48 are metal-oxide-semiconductor transistors. In this embodiment, the second common-mode feedback circuit 58 is preferably arranged to adjust the common-mode level at the output port 22 upward to a level which insures that, as signal swing increases, the transistors 41 and 42 do not enter saturation until after the cascode transistors 47 and 48 enter their triode regions.

Because the transistors 41 and 42 of FIG. 1 are not cascoded, the second differential pair 40 limits the gain of the second amplifier stage 24 more than does the cascoded current-source transistors 45 and 46. Operational entry of the cascode transistors 47 and 48 into their triode regions will not, therefore, significantly reduce stage gain. At this point, the transistors 41 and 42 will still be operating above saturation so that dynamic range is enhanced. To maintain currents at the amplifier output port, the bias voltages $V_5$ and $V_6$ are preferably selected so that the cascode transistors 47 and 48 enter their triode regions before the current-source transistors 45 and 46 enter theirs.

The dynamic range increase realized by the second common-mode feedback circuit 58 is complemented by action of the first common-mode feedback circuit 57. This circuit is configured to lower the controlled level at the second differential port (control terminals of the second differential pair 40). This level is lowered to provide more room for the current terminals of the second differential pair so that their entry into saturation is delayed as signal levels are increased at the amplifier output port 22.

Lowering the controlled level at the second differential port also lowers the controlled level at the current terminals of the cascode transistors 37 and 38 so that entry into saturation of the first differential pair 26 is delayed as signal levels are increased at the amplifier input port 21. The level shift provided by the transistor followers 51 and 52 acts to properly position the common-mode levels of the first and second amplifier stages 23 and 24. Lowering the controlled level at the current terminals of the cascode transistors 37 and 38 also apportions additional headroom to the current-source transistors 31 and 32 which allows insertion of the impedance-increasing cascode transistors 33-36.

Figure 2:
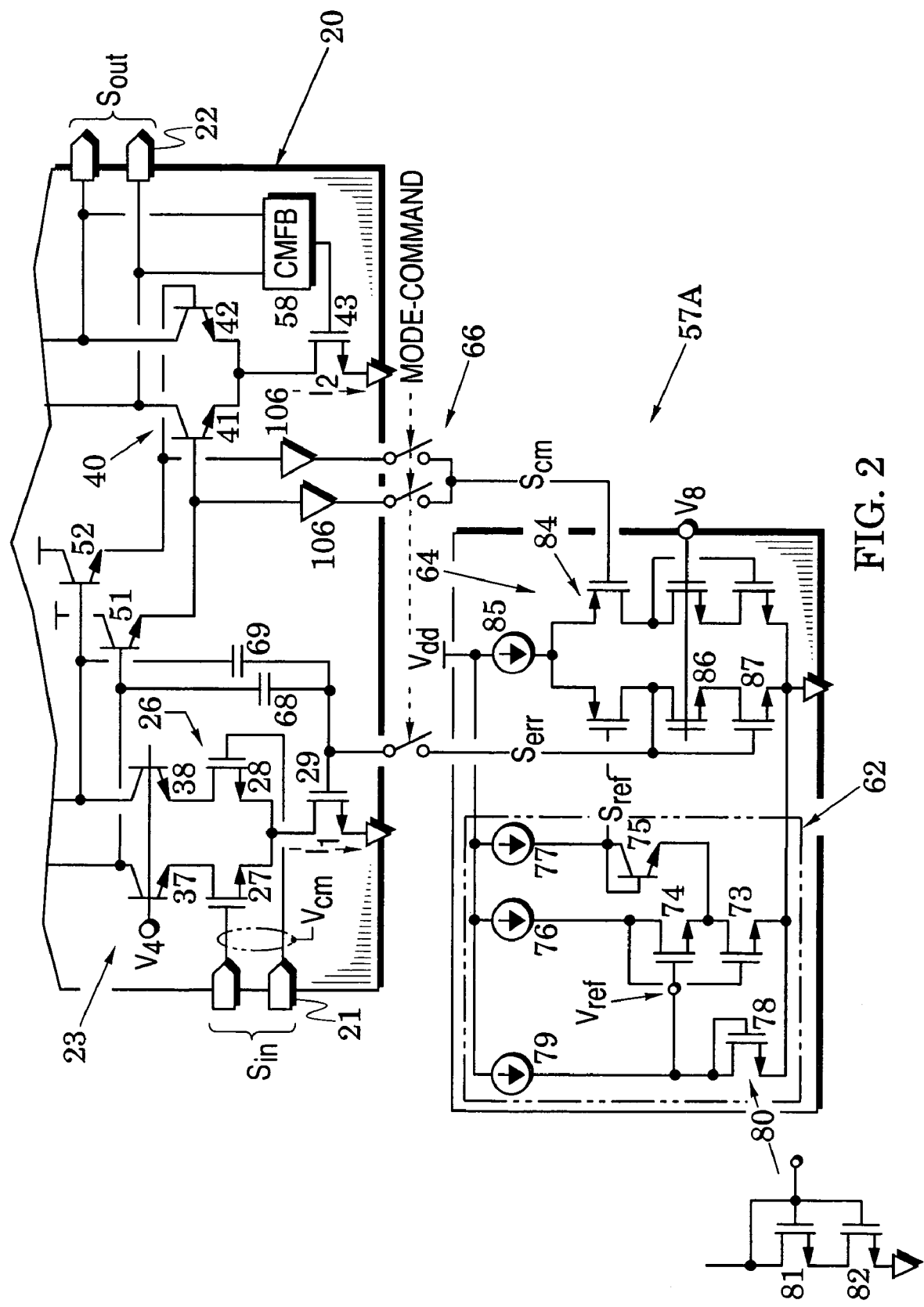
FIGS. 2-4 are schematics of other amplifier embodiments.
Figure 3:
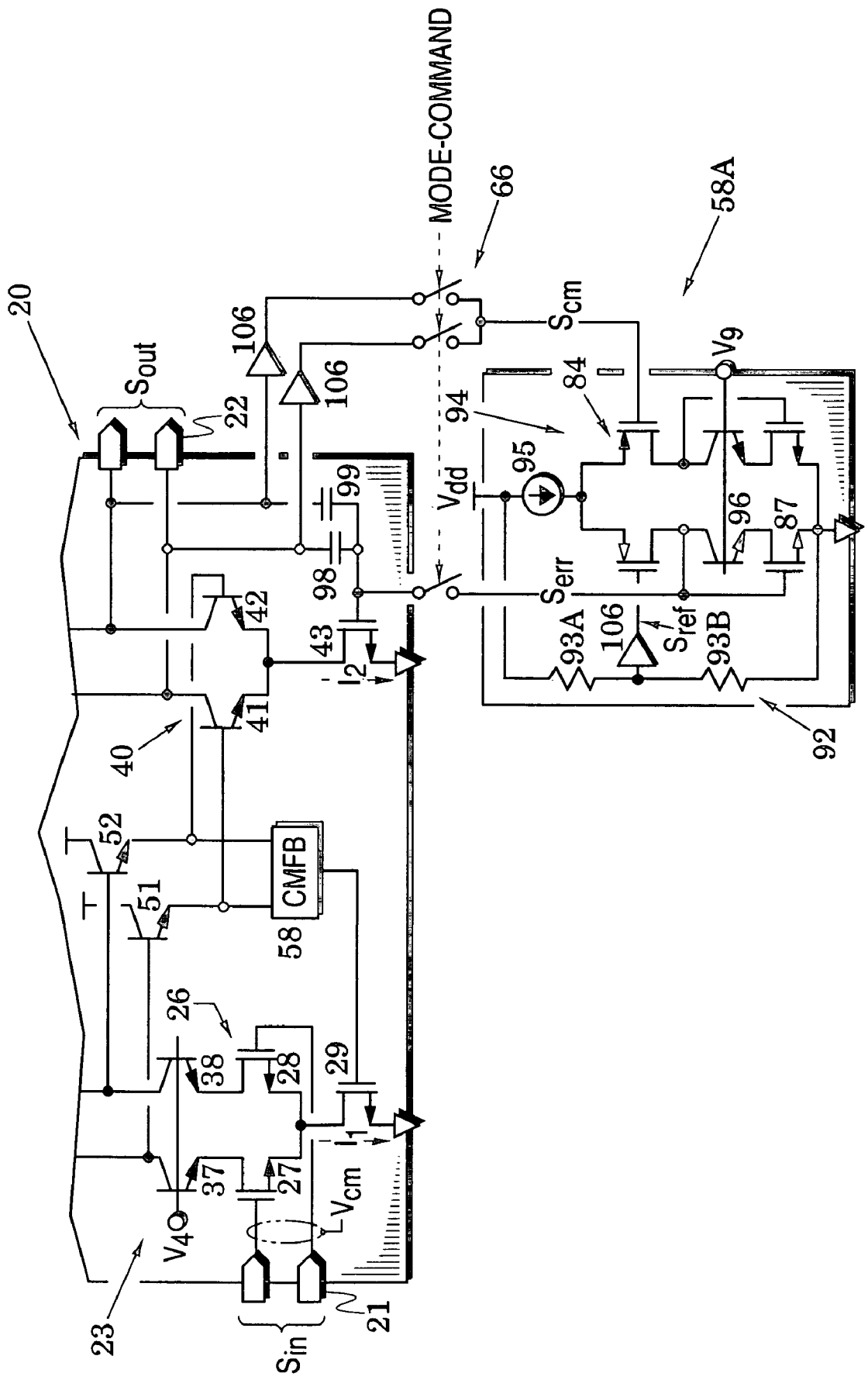
Figure 4:
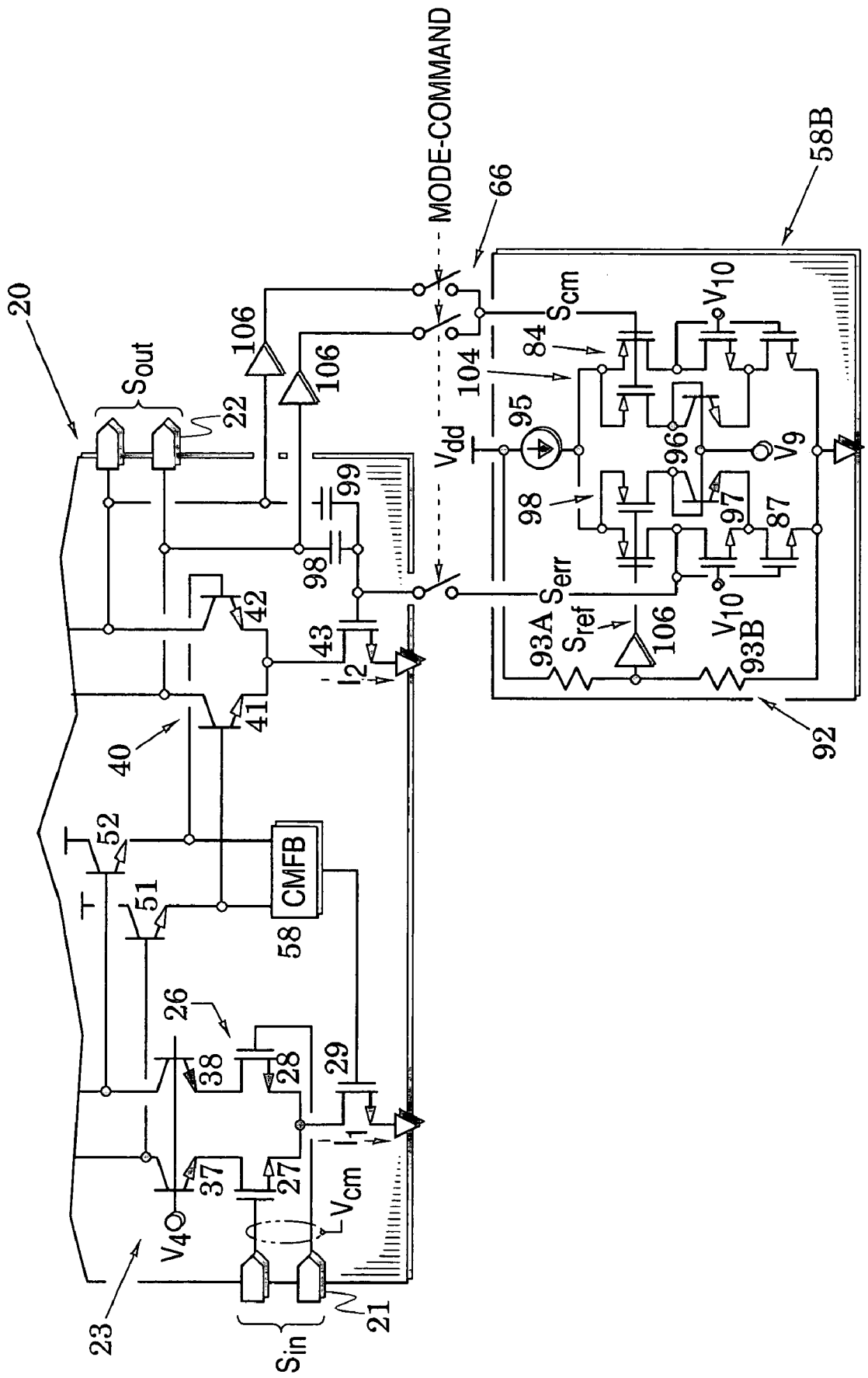

Embodiments of the first and second common-mode feedback circuits are shown in FIGS. 2-4. These embodiments controllably reduce drain voltages of the first and second current-source transistors 29 and 43 to thereby reduce signal levels at the current terminals of the cascode transistors 37 and 38 and current terminals of the second differential pair 40. These reduced signal levels not only enhance dynamic range of the differential amplifier 20 but also facilitate insertion of the impedance-increasing cascode transistors 33-36 and cascode transistors 47 and 48. In the embodiment of FIG. 1, the first amplifier stage 23 is thus "triple cascoded" and the second amplifier stage 24 is "double cascoded" which significantly enhances signal gain (although the current-source transistors 31, 32, 45 and 46 initiate currents, they are often considered to be an additional cascading layer because they also enhance output impedance).

An embodiment 57A of the first common-mode feedback circuit 57 of FIG. 1 is illustrated in FIG. 2. This figure includes the lower portion of the structures of FIG. 1 and shows that the common-mode feedback circuit embodiment 57A includes a reference generator 62, a differential feedback amplifier 64 and a set 66 of mode switches that respond to a mode-command signal. As mentioned above, the first current-source transistor 29 can also be considered to be part of the feedback circuit 57A. To enhance illustrative clarity, some elements of FIG. 1 (e.g., the current-source transistors 53 and 54) are not shown in FIG. 2.

In operation, the reference generator 62 provides a reference signal $S_{ref}$ to one input of the differential feedback amplifier 64 and the other input receives the signal level at the second differential port (control terminals of the second differential pair 40) via switches of the switch set 66. In response to these inputs, the feedback amplifier 64 provides an error signal $S_{err}$ which causes the first current-source transistor 29 to alter the first tail current $I_1$. This alteration changes the common-mode level at the first and second differential ports which are the ports at the opposite sides of the transistor followers 51 and 52. This feedback operation acts to reduce the error signal so that the common-mode level at the second differential port is controlled to substantially approximate that of the reference signal $S_{ref}$.

Although the first common-mode feedback circuit 57A of FIG. 2 can be used in a variety of amplifier applications, it is particularly suited for use in amplifier applications in which there are alternating operational modes. For example, the amplifier structure of FIG. 2 can be used in a switched-capacitor multiplying digital-to-analog converter (MDAC) which has a sample operational mode and a hold operational mode. Samples of an input signal are received into capacitors during the sample mode and switches configure the MDAC during the hold mode to develop a residue signal in capacitors coupled about the amplifier. The residue signal can be used, for example, for signal conversion in a succeeding converter stage of a pipelined signal converter.

To enhance accuracy of the residue signal, it is important the amplifier's common-mode levels are maintained with the speed necessary to suppress transient signals that may enter the amplifier during the hold mode. Typically, the first common-mode feedback circuit does not provide the required speed. Preferably, therefore, signal-holding capacitors 68 and 69 are coupled between the first differential port (at inputs of the transistor followers 51 and 52) and the control terminal of the current-source transistor 29 to thereby maintain the common-mode levels during the amplifier hold modes.

In feedback operation, the first common-mode feedback circuit 57A thus establishes common-mode levels at the second differential port ((control terminals of the second differential pair 40) during successive sample modes. In the intervening hold modes, the mode-command signal opens the switches of the switch set 66. During the generally-brief hold modes, signal levels across each of the capacitors 68 and 69 do not substantially change so that the established common-mode levels are maintained until subsequent sample modes in which the feedback loop closes to update the accuracy of the common-mode levels.

As the sample and hold modes are alternated, it is important to assure that the transistors 41 and 42 of the second differential pair 40 do not latch-up if they go into saturation during start-up. This is accomplished with clamps that prevent latch-up. For example, FIG. 1 shows that latch transistor followers 59 and 60 are inserted with their control terminals coupled respectively to the control terminals of the transistor followers 51 and 52 and their current terminals coupled to the amplifier output port. These clamp transistors prevent the current terminals of the second differential pair 40 from falling below their control terminals.

Attention is now returned to the common-mode feedback circuit 57A of FIG. 2. It is noted that reducing the common-mode level at the second differential port ((control terminals of the second differential pair 40) allows for greater signal range, i.e., greater dynamic range. However, this common-mode level should not be lowered to a point where the second current-source transistor 43 is urged into its triode region of operation in which its output impedance significantly drops. It is thus noted that amplifier dynamic range can be further enhanced with a tight control over the bias levels of the second differential pair 40 and its associated current-source transistor 43.

The reference generator 62 of FIG. 2 therefore includes a replica transistor 73, a compression transistor 74 and a diode-coupled transistor 75. The replica and compression transistors receive the current of a current source 76 and the compression transistor 74 is coupled between a control terminal and a current terminal of the replica transistor 73 and has a control terminal arranged to receive a reference voltage $V_{ref}$. The control terminal of the diode-coupled transistor 75 provides the error signal $S_{err}$.

It is initially noted that a metal-oxide-semiconductor transistor must be biased past its triode region and into its saturation region to maintain a high output impedance. For any given gate-to-source voltage $V_{gs}$, the triode region abuts the saturation region at a point where the drain-to-source voltage $V_{ds}$ equals $V_{dsat}$ which is defined as the point where $V_{ds}=V_{gs}-V_t$ wherein $V_t$ is the transistor's threshold voltage.

In the absence of the compression transistor 74, the replica transistor 73 would be diode-coupled so that $V_{ds}=V_{gs}$ and, accordingly, the replica transistor would be biased past $V_{dsat}$ by the threshold voltage $V_t$ (which is on the order of 500 mv for a 0.18 μm MOS fabrication process).

In the reference generator 62, however, the current of the current source 76 flows through the replica and compression transistors and establishes corresponding gate-to-source voltages $V_{gs}$. Because the reference voltage $V_{ref}$ less the gate-to-source voltage $V_{gs}$ of the compression transistor 74 equals the drain-to-source voltage $V_{ds}$ of the replica transistor 73, the reference voltage $V_{ref}$ can be selected to compress the drain-to-source voltage $V_{ds}$ of the replica transistor closer to $V_{dsat}$. For example, the reference voltage $V_{ref}$ may be lowered to compress the drain-to-source voltage $V_{ds}$ downward to where it exceeds $V_{dsat}$ by a very small but controlled margin (e.g., 100 millivolts). The replica transistor 73 replicates the bias conditions that are desired for the current-source transistor 43.

The diode-coupled transistor 75 carries the current of a current source 77 and these elements can be selected so that the voltage between control and current terminals of the diode-coupled transistor 75 mimics that of the transistors 41 and 42 of the second differential pair 40. Therefore, the reference signal $S_{ref}$ provides a voltage level that would, if applied to the control terminals of the second differential pair 40, bias the current-source transistor 43 to have a drain-to-source voltage $V_{ds}$ that exceeds $V_{dsat}$ by a very small but controlled margin.

Accordingly, the headroom of the second differential pair 40 is enhanced and the dynamic range of the differential amplifier 20 similarly enhanced. At this point, it is noted that the common-mode level at the first differential port (current terminals of the cascode transistors 37 and 38) is level shifted above the common-mode level of the second differential port (control terminals of the second differential pair 40) by the transistor followers 51 and 52.

The reference generator 62 includes a diode-coupled transistor 78 that receives current from a current source 79. Because it is diode-coupled, the transistor 78 is biased into its saturation region and provides a large output impedance. The size of this transistor 78 can be selected so that its drain-to-source voltage $V_{ds}$ provides the desired reference voltage $V_{ref}$. Alternatively, the current of the current source 79 can be selected to realized the desired reference voltage $V_{ref}$.

As indicated by the replacement arrow 80, the diode-coupled transistor 78 can be replaced by a diode-coupled transistor 81 that is coupled between the control and current terminals of another transistor 82. This arrangement places the operation of transistor 81 in the saturation region but places the operation of transistor 82 in its triode region. Transistor sizes or the current or the current source 79 can be selected to provide the desired reference voltage $V_{ref}$.

The differential feedback amplifier 64 is formed with a differential pair 84 of transistors that steer a tail current that is provided by a current source 85 across a differential load. Each side of this load is formed with a compression transistor 86 that is coupled between the control and a current terminals of a replica transistor 87 and has a control terminal arranged to receive a bias voltage $V_8$.

Preferably, the bias voltage $V_8$ is selected to equal the common-mode voltage $V_{cm}$ at the input port 21 (indicated in FIG. 2). In a manner similar to that described above relative to the transistors 73 and 74 of the reference generator 62, the bias voltage $V_8$ urges the drain-to-source voltage $V_{ds}$ of transistor 87 downward to where it exceeds $V_{dsat}$ by a very small but controlled margin (e.g., 100 millivolts). This bias level exists when the differential pair 84 is carrying the current supplied by the current-source transistor 85.

The compression and replica transistors 86 and 87 now form with the current-source transistor 29 a current mirror in which the first tail current $I_1$ is mirrored and controlled to mimic one half of the current of the current source 85 and the drain-to-source voltages $V_{ds}$ of the current source 29 and the replica transistor 87 operate very close to $V_{dsat}$ and carry substantially equal currents.

It is important to note that the sizes of the replica transistor 73, the compression transistor 74, and the diode-coupled transistor 75 (in the reference generator 62) can be significantly reduced from the sizes of the current-source transistor 43 and the transistors 41 and 42 by also reducing the currents from the current sources 76 and 77 relative to the tail current $I_2$. That is, these transistor sizes and current-source currents can be significantly reduced as long as current scaling in the replica transistor 73 and the compression transistor 74 and current density in the diode-coupled transistor 75 are maintained substantially equal to respective parameters in the current-source transistor 43 and the transistors 41 and 42. In the replica and compression transistors 73 and 74, gate widths W are preferably altered to obtain the current scaling while gate lengths L are left substantially equal to that of the current-source transistor 43.

Because of similar current scaling and current density, bias tracking over disturbing effects such as temperature and process variations is substantially improved and the biasing of the second differential pair 40 and the current-source transistor 43 transistors remains substantially constant. Thus, enhanced bias tracking is obtained while significantly reducing current drain and power consumption.

It is also important to note that the current of the current source 85 can be significantly reduced as long as this is accompanied with corresponding current-density and current-scaling alterations in the differential pair 84 and the compression and replica transistors 86 and 87. The current flowing through the replica transistor 87 is thus significantly less than the mirrored tail current $I_1$ so that current drain and power consumption are further reduced.

Attention is now directed to FIG. 3 which illustrates an embodiment 58A of the common-mode feedback circuit 58 of FIG. 1. Similar to FIG. 2, this figure also includes the lower portion of the structures of FIG. 1. In addition, FIG. 3 shows that the common-mode feedback circuit embodiment 58A includes a reference generator 92 and a differential feedback amplifier 94 and also a set 66 of mode switches that respond to a mode-command signal. In an embodiment, the second current-source transistor 43 can also be considered to be part of the feedback circuit 58A.

In the feedback circuit 58A, the reference generator 92 is a voltage divider that comprises a pair of serially-coupled resistors 93A and 93B which divide the bias voltage $V_{bias}$ to thereby generate the reference signal $S_{ref}$. The feedback amplifier 94 is similar to the feedback amplifier 64 of FIG. 2 except that the replica transistors 86 are replaced by replica transistors 96 whose transistor structure is the same as that of the transistors 41 and 42 of the second differential pair 40.

The replica transistor 96 is biased with a bias voltage $V_9$ that differs somewhat from the bias voltage $V_8$ of FIG. 3 because of the different transistor structure. In addition, the current source 85 is replaced by a current source 95 which provides a greater current.

The compression and replica transistors 96 and 87 now form with the current-source transistor 43 a current mirror in which the second tail current $I_2$ is mirrored and controlled to mimic one half of the current of the current source 95 and the drain-to-source voltages $V_{ds}$ of the current-source transistor 43 and the replica transistor 87 operate very close to $V_{dsat}$ and carry substantially equal currents.

In operation, the reference generator 92 provides a reference signal $S_{ref}$ to one input of the differential feedback amplifier 94 and the other input receives the signal level at the amplifier output port 22. In response to these inputs, the feedback amplifier 94 provides an error signal $S_{err}$ which causes the second current-source transistor 43 to alter the second tail current $I_2$.

This alteration controls the common-mode level at the amplifier output port 22 to substantially mimic the level of the reference signal $S_{ref}$. The resistances of the resistors 93A and 93B can be selected to controllably place the reference level at a point that best enhances the dynamic range of signals at the amplifier output port 22 (e.g., somewhat above one half of the supply voltage $V_{dd}$).

When the amplifier of FIG. 3 is used in applications which involve alternating operational modes, signal-holding capacitors 98 and 99 (similar to the signal-holding capacitors 68 and 69 of FIG. 2) may be coupled between the amplifier output port 22 and the control terminal of the current-source transistor 43 to maintain the common-mode levels during amplifier hold modes.

FIG. 4 is similar to FIG. 3 with like elements indicated by like reference numbers. In FIG. 4, the differential feedback circuit 58A is replaced by a feedback circuit 58B that includes a differential feedback amplifier 104. This feedback amplifier differs from the feedback amplifier 94 of FIG. 3 by replacement of the compression transistor 96 with a compression transistor 97 of a different transistor structure. In addition, the compression transistor 96 has been diode-coupled and moved to be coupled between the replica transistor 87 and a transistor of a differential pair 98 that has been positioned in parallel with the differential pair 84. The diode-coupled transistor 96 remains biased by the bias voltage $V_9$ and the replica transistor 97 is biased by a bias voltage $V_{10}$ that differs somewhat because of the different transistor type.

The compression and replica transistors 97 and 87 and the diode-coupled transistor 96 now form with the current-source transistor 43 a current mirror in which the second tail current $I_2$ is mirrored and controlled to mimic one half of the current of the current source 95 and the drain-to-source voltages $V_{ds}$ of the current-source transistor 43 and the replica transistor 87 operate very close to $V_{dsat}$ and carry substantially equal currents. It has been found that the current mirror arrangement of FIG. 4 controls the second tail current especially well over temperature.

The differential amplifier embodiments of FIGS. 2-4 are enhanced by adding isolation between various amplifier elements. For example, it is desirable to insert buffers 106 between the amplifier output port 22 and the feedback circuit 58B and between the reference generator 92 and the feedback amplifier 104. Similar buffers have been inserted for isolation in FIGS. 2 and 3.

With respect to the first common-mode feedback circuit embodiment 57A of FIG. 2, it was previously noted that currents could be reduced as long as corresponding reductions were made in device sizes so that current scaling and current density correspondence was maintained with respective devices in the first and second amplifier stages 23 and 24. Similar reductions can be obtained in the second common-mode feedback circuit embodiments 58A and 58B of FIGS. 3 and 4 to further reduce current drain and power consumption.

The differential amplifier embodiments of the present invention can be advantageously used in a variety of signal conditioning systems such as the pipelined converter system 120 of FIG. 5. The system 120 includes a sampler 124, an initial converter stage 126 and at least one successive converter stage 128 and converts an analog input signal $S_{in}$ at an input port 121 to a corresponding digital code signal $S_{code}$ at an output port 122. The conversion is accomplished by successive (i.e., pipelined) conversions in the successive converter stages.

In particular, the sampler 124 provides a sample signal $S_{smpl}$ in response to the input signal $S_{in}$ and the initial converter stage 126 processes the sample signal $S_{smpl}$ to provide respective digital codes $C_{dgtl}$ and also provide a residue signal $S_{res}$ to a succeeding converter stage. In similar fashion, each successive converter stage 128 processes a preceding residue signal $S_{res}$ to provide respective digital codes $C_{dgtl}$ and provide a respective residue signal $S_{res}$ to a succeeding converter stage. However, the final one of the successive converter stages only provides respective digital codes $C_{dgtl}$ as it has no need to provide a residue signal. The converter stages of the system 120 are generally configured to provide extra digital bits so that the system can include a correction logic 130 which corrects processing errors and generates the final digital code signal $S_{fnl}$.

The initial converter stage 126 typically has an initial converter 132 (e.g., a flash ADC) that converts the sample signal $S_{smpl}$ to respective digital codes $C_{dgtl}$. The initial converter stage also has a multiplying digital-to-analog converter (MDAC) 134 that receives the sample signal $S_{smpl}$ and also receives a decision signal 136 from the initial converter 132. The decision signal indicates which of possible digital codes $C_{dgtl}$ is being provided at any given moment by the initial converter 132.

The successive converter stages 128 processes the residue signal $S_{res}$ of the preceding stage and is configured similarly to the initial converter stage 126. For example, they have a successive converter 142 and a successive MDAC 144 that receives a decision signal 146 from the successive converter 142. In contrast, the final converter stage is formed with just a converter 142.

FIGS. 6A and 6B show a switched-capacitor network embodiment 160 of the MDACs 134 and 144 of FIG. 4. The network 160 has first and second capacitors 162 and 163, first and second switches 164 and 165, and a differential amplifier 166 that drives an output terminal 150. The first capacitor 162 has an upstream plate that is coupled to an input terminal 168 and to the second switch 165 and a downstream plate coupled to an inverting input of the differential amplifier 166.

The second capacitor 163 has an upstream plate coupled to the inverting input of the differential amplifier and a downstream plate coupled to the output of the differential amplifier. The first switch 164 is coupled to the inverting input of the differential amplifier 166.

In a first operational mode of the network 160 that is shown in FIG. 6A, the first switch 164 closes in response to a first mode-command signal φ1 (e.g., a clock signal) to thereby establish a signal path 170. A signal sample $S_{smpl}$ from the input port 148 (i.e., from the sampler 144 of FIG. 5) is passed over the signal path 171 and received in the first capacitor 162 as a stored electrical charge.

In a second operational mode of the network 160 that is shown in FIG. 6B, the second switch 165 moves to a selected position in response to a second mode-command signal φ2 (e.g., a clock signal) to thereby establish a signal path 171. The switch position is determined by a decision signal from a respective converter (e.g., the converter 132 of FIG. 5) that corresponds to the digital code $C_{dgtl}$ of that converter. Charge is transferred over the signal path 171 to generate an appropriate residue signal $S_{res}$ at the output port 169.

The differential amplifier embodiments of the invention are especially suited for use as differential amplifier 166 of FIGS. 6A and 6B. In particular, their enhanced gain and dynamic range substantially increases the accuracy of the generated residue signal $S_{res}$. As previously noted, these advantages can be obtained in low-voltage applications where reduced supply voltages typically tend to limit the gain and/or signal swing of amplifiers.

The amplifier and converter structures of FIGS. 1-6 are shown as single-ended embodiments for clarity of illustration but it is clear that, by simple, extension, they also teach and provide differential embodiments.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. An amplifier that processes signals from an amplifier input port to an amplifier output port, comprising:
    a first differential pair of transistors that define said amplifier input port and a first differential port and are coupled to steer a first tail current across said first differential port in response to signals at said amplifier input port;
    a second differential pair of transistors that define a second differential port for receiving signals from said first differential port and that define said amplifier output port and are coupled to steer a second tail current across said amplifier output port in response to signals at said second differential port; and
    at least one feedback circuit arranged to mirror and adjust at least one of said first and second tail currents in response to signals from at least one of said second differential port and said amplifier output port;
    wherein said feedback circuit includes:
    a current source;
    a reference generator that provides a reference signal;
    a feedback amplifier configured to mirror said first tail current from said current source to said first differential pair and provide an error signal to adjust said first tail current in response to a difference between said reference signal and a common-mode signal at said second differential port.

2. The amplifier of claim 1, further including transistor followers inserted between said first and second differential ports to pass signals from said first differential port to said second differential port.

3. The amplifier of claim 1, wherein said feedback amplifier includes:
    a replica transistor; and
    a compression transistor coupled between a control terminal and a current terminal of said replica transistor with said control terminal coupled to mirror said first tail current from said current source.

4. The amplifier of claim 3, wherein said compression transistor has a control terminal which receives a reference voltage that approximates a common-mode level at said amplifier input port.

5. The amplifier of claim 1, wherein said reference generator includes:
a replica transistor;
a compression transistor coupled between a control terminal and a current terminal of said replica transistor; and
a diode-coupled transistor coupled to said control terminal to provide said reference signal.

6. The amplifier of claim 1, further including:
a current-source transistor coupled to provide said first tail current in response to said error signal;
a set of mode switches inserted to couple said feedback amplifier to said current-source transistor and said second differential port in selected ones of operational modes; and
signal-holding capacitors coupled between said current-source transistor and said first differential port.

7. The amplifier of claim 1, further including:
bipolar cascode transistors inserted into said first differential port to increase its output impedance;
current-source transistors positioned to provide currents to said first differential pair; and
at least one set of cascode transistors inserted between said bipolar cascode transistors and said current-source transistors to further increase impedance at said first differential port.

8. An amplifier that processes signals from an amplifier input port to an amplifier output port, comprising:
a first differential pair of transistors that define said amplifier input port and a first differential port and are coupled to steer a first tail current across said first differential port in response to signals at said amplifier input port;
a second differential pair of transistors that define a second differential port for receiving signals from said first differential port and that define said amplifier output port and are coupled to steer a second tail current across said amplifier output port in response to signals at said second differential port; and
at least one feedback circuit arranged to mirror and adjust at least one of said first and second tail currents in response to signals from at least one of said second differential port and said amplifier output port;
wherein said feedback circuit includes:
a current source;
a reference generator that provides a reference signal;
a feedback amplifier configured to mirror said second tail current from said current source to said second differential pair and provide an error signal to adjust said second tail current in response to a difference between said reference signal and a common-mode signal at said amplifier output port.

9. The amplifier of claim 8, further including transistor followers inserted between said first and second differential ports to pass signals from said first differential port to said second differential port.

10. The amplifier of claim 8, wherein said feedback amplifier includes:
a replica transistor; and
a compression transistor coupled between a control terminal and a current terminal of said replica transistor with said control terminal coupled to mirror said second tail current from said current source.

11. The amplifier of claim 10, wherein said compression transistor has a control terminal which receives a reference voltage that approximates a common-mode level at said second differential port.

12. The amplifier of claim 8, wherein said reference generator comprises a voltage divider that provides said reference signal.

13. The amplifier of claim 8, further including:
a current-source transistor coupled to provide said second tail current in response to said error signal;
a set of mode switches inserted to couple said feedback amplifier to said current-source transistor and said amplifier output port in selected ones of operational modes; and
signal-holding capacitors coupled between said current-source transistor and said amplifier output port.

14. The amplifier of claim 8, further including current-source transistors positioned to provide currents to said second differential pair, and
at least one set of cascode transistors inserted between said second differential pair and said current-source transistors to increase impedance at said amplifier output port.

15. An amplifier that processes signals from an amplifier input port to an amplifier output port, comprising:
a first current source
a first differential pair of transistors that define said amplifier input port and a first differential port and are coupled to steer a first tail current across said first differential port in response to signals at said amplifier input port;
first current-source transistors biased to provide currents;
two sets of cascode transistors inserted to couple said first current-source transistors to said first differential port;
a second current source
a second differential pair of transistors that define a second differential port for receiving signals from said first differential port and that define said amplifier output port and are coupled to steer a second tail current across said amplifier output port in response to signals at said second differential port;
second current-source transistors biased to provide currents;
a set of cascode transistors inserted to couple said second current-source transistors to said amplifier output port;
a first feedback circuit arranged to mirror said first tail current from said first current source and adjust said first tail current in response to signals from said second differential port; and
a second feedback circuit arranged to mirror said second tail current from said second current source and to adjust said second tail current in response to signals from said second differential port.

16. The amplifier of claim 15, further including transistor followers inserted between said first and second differential ports to pass signals from said first differential port to said second differential port and wherein said first feedback circuit includes:
a first reference generator that provides a first reference signal; and
a first feedback amplifier configured to mirror and adjust said first tail current in response to a difference between said first reference signal and a common-mode signal at said second differential port;
and wherein said second feedback circuit includes:

a second reference generator that provides a second reference signal; and a second feedback amplifier configured to mirror and adjust said second tail current in response to a difference between said second reference signal and a common-mode signal at said amplifier output port.

17. The amplifier of claim 16, further including:

a third current-source transistor coupled to provide said first tail current in response to said first feedback circuit;

a first set of mode switches inserted to couple said first feedback amplifier to said third current-source transistor and said second differential port in selected ones of operational modes;

a fourth current-source transistor coupled to provide said second tail current in response to said second feedback circuit;

a second set of mode switches inserted to couple said second feedback amplifier to said fourth current-source transistor and said amplifier output port in selected ones of said operational modes; and signal-holding capacitors coupled between said third current-source transistor and said first differential port and between said fourth current-source transistor and said second differential port.

18. A signal converter system for converting an analog input signal into a corresponding digital code, the system comprising:

at least two converter stages coupled in series to receive said analog input signal and each convert a respective portion of said analog input signal into a respective code portion of said digital code wherein at least one of said stages includes:

an analog-to-digital converter that provides that stage's code portion and a selected one of a set of reference signals; and a switched-capacitor network that generates the respective portion of a succeeding one of said converter stages with the aid of a differential amplifier that processes signals from an amplifier input port to an amplifier output port and includes:

a) a first current source;

b) a first differential pair of transistors that define said amplifier input port and a first differential port and are coupled to steer a first tail current across said first differential port in response to signals at said amplifier input port;

c) a second current source;

d) a second differential pair of transistors that define a second differential port for receiving signals from said first differential port and that define said amplifier output port and are coupled to steer a second tail current across said amplifier output port in response to signals at said second differential port; and e) a first feedback circuit arranged to mirror said first tail current from said first current source and adjust said first tail current in response to signals from said second differential port; and f) a second feedback circuit arranged to mirror said second tail current from said second current source and to adjust said second tail current in response to signals from said second differential port.

19. The system of claim 18, further including transistor followers inserted between said first and second differential ports to pass signals from said first differential port to said second differential port and wherein said first feedback circuit includes:

a first reference generator that provides a first reference signal; and a first feedback amplifier configured to adjust said first tail current in response to a difference between said first reference signal and a common-mode signal at said second differential port;

and wherein said second feedback circuit includes:

a second reference generator that provides a second reference signal; and a second feedback amplifier configured to adjust said second tail current in response to a difference between said second reference signal and a common-mode signal at said amplifier output port.

20. The system of claim 19, further including a third current-source transistor coupled to provide said first tail current in response to said first feedback circuit;

a first set of mode switches inserted to couple said first feedback amplifier to said third current-source transistor and said second differential port in selected ones of operational modes;

a fourth current-source transistor coupled to provide said second tail current in response to said second feedback circuit;

a second set of mode switches inserted to couple said second feedback amplifier to said fourth current-source transistor and said amplifier output port in selected ones of said operational modes; and signal-holding capacitors coupled between said third current-source transistor and said first differential port and between said fourth current-source transistor and said second differential port.

* * * * *